United States Patent [19]

Holder

[11] Patent Number: 5,288,366
[45] Date of Patent: Feb. 22, 1994

[54] METHOD FOR GROWING MULTIPLE SINGLE CRYSTALS AND APPARATUS FOR USE THEREIN

[75] Inventor: John D. Holder, Lake St. Louis, Mo.
[73] Assignee: MEMC Electronic Materials, Inc., St. Peters, Mo.
[21] Appl. No.: 873,375
[22] Filed: Apr. 24, 1992
[51] Int. Cl.[5] .............................................. C30B 15/12
[52] U.S. Cl. ............................ 156/617.1; 156/618.1; 156/DIG. 115; 422/253
[58] Field of Search .................. 156/601, 617.1, 618.1, 156/DIG. 115; 422/249, 253

[56] References Cited

U.S. PATENT DOCUMENTS

| | | | |
|---|---|---|---|
| 2,893,847 | 7/1959 | Schweickert et al. | 23/273 |
| 3,337,303 | 8/1967 | Lorenzini et al. | 156/DIG. 115 |
| 4,036,595 | 7/1977 | Lorenzini et al. | 23/273 |
| 4,134,785 | 1/1979 | Lavigna et al. | 156/601 |
| 4,249,988 | 2/1981 | Lavigna et al. | 156/605 |
| 4,454,096 | 6/1984 | Lorenzini et al. | 422/249 |
| 4,710,260 | 12/1987 | Witter et al. | 156/DIG. 115 |
| 4,894,206 | 1/1990 | Yamashita et al. | 422/249 |
| 4,936,949 | 6/1990 | Kida et al. | 156/617.1 |
| 4,981,549 | 1/1991 | Yamashita et al. | 156/620.4 |
| 5,009,862 | 4/1991 | Kida et al. | 422/249 |
| 5,034,200 | 7/1991 | Yamashita et al. | 422/249 |
| 5,067,989 | 11/1991 | Yokota et al. | 148/33 |
| 5,087,321 | 2/1992 | Kamio et al. | 156/608 |
| 5,087,429 | 2/1992 | Kamio et al. | 422/249 |
| 5,131,974 | 7/1992 | Oda et al. | 422/249 |

OTHER PUBLICATIONS

George Fiegl and Walter Torbet of Siltec Corp. for NASA's Jet Propulsion Laboratory, "Two-Crucible Czochralski Process," NASA Tech Briefs, Spring 1984.
Electronics, "Silicon Furnace Gets Multiple Charges," Electronics, Jun. 22, 1978, pp. 44–45.
W. Zulehner et al., "Czochralski-Grown Silicon," Crystals; Growth, Properties, and Applications 8, pp. 32, 91–104 (1982).

Primary Examiner—Olik Chaudhuri
Assistant Examiner—Felisa Garrett
Attorney, Agent, or Firm—Senniger, Powers, Leavitt & Roedel

[57] ABSTRACT

A method for growing multiple high-purity single crystals from a replenished melt by maintaining the purity of molten source material in the melt held in a crucible in a furnace of the type used for growing high-purity single crystals. The method includes the steps of growing at least one crystal from the source material in the crucible, extracting a portion of a volume of the melt remaining in the crucible, adding high-purity source material to the melt, and growing at least one more single crystal. Extractor apparatus used in the method includes an insulated receptacle having an inlet tube for conducting molten source material into the receptacle. A vacuum attached to the receptacle is used to draw the source material into the receptacle.

8 Claims, 11 Drawing Sheets

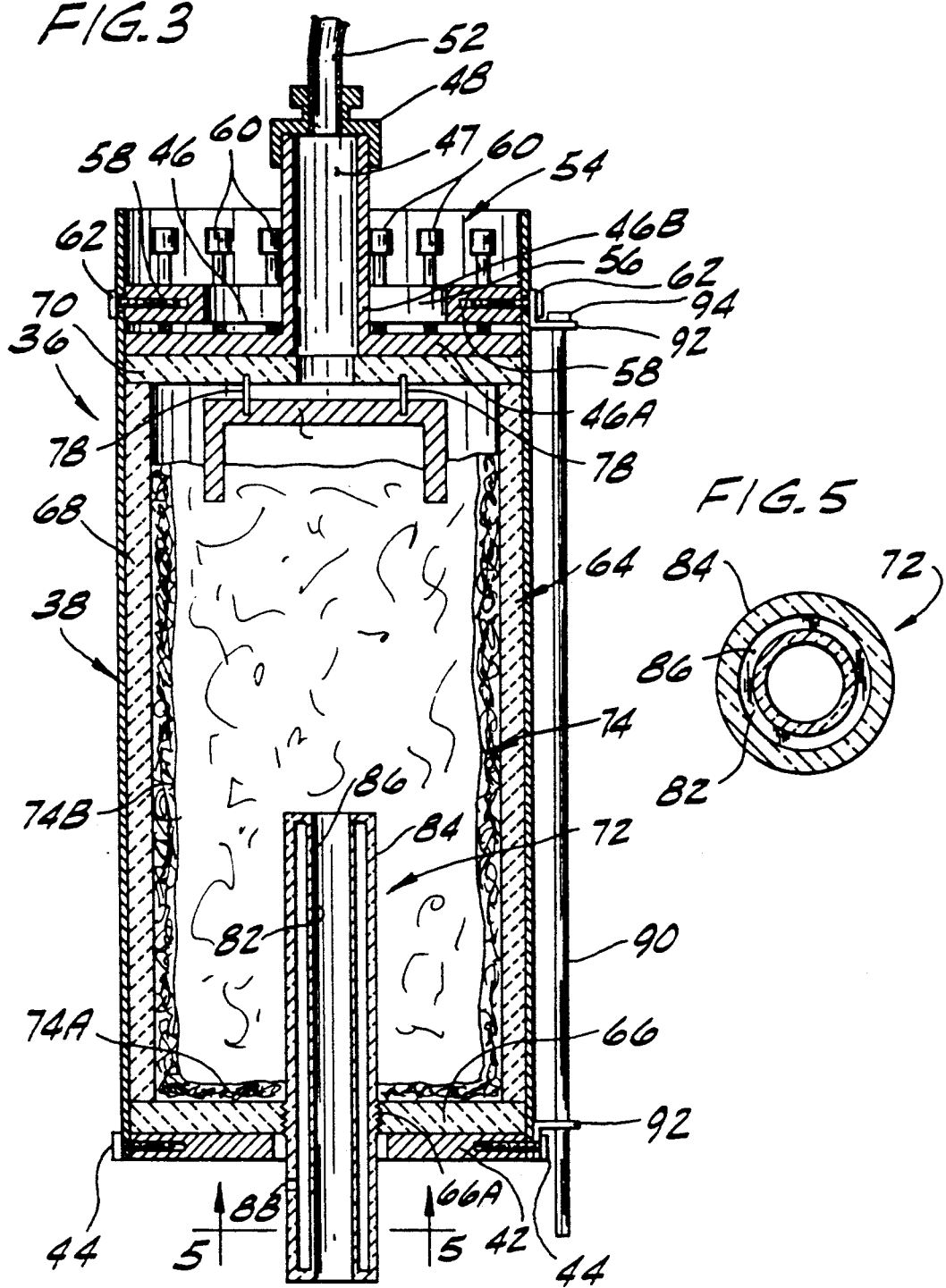
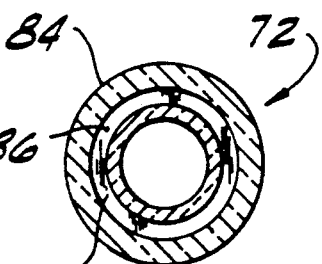

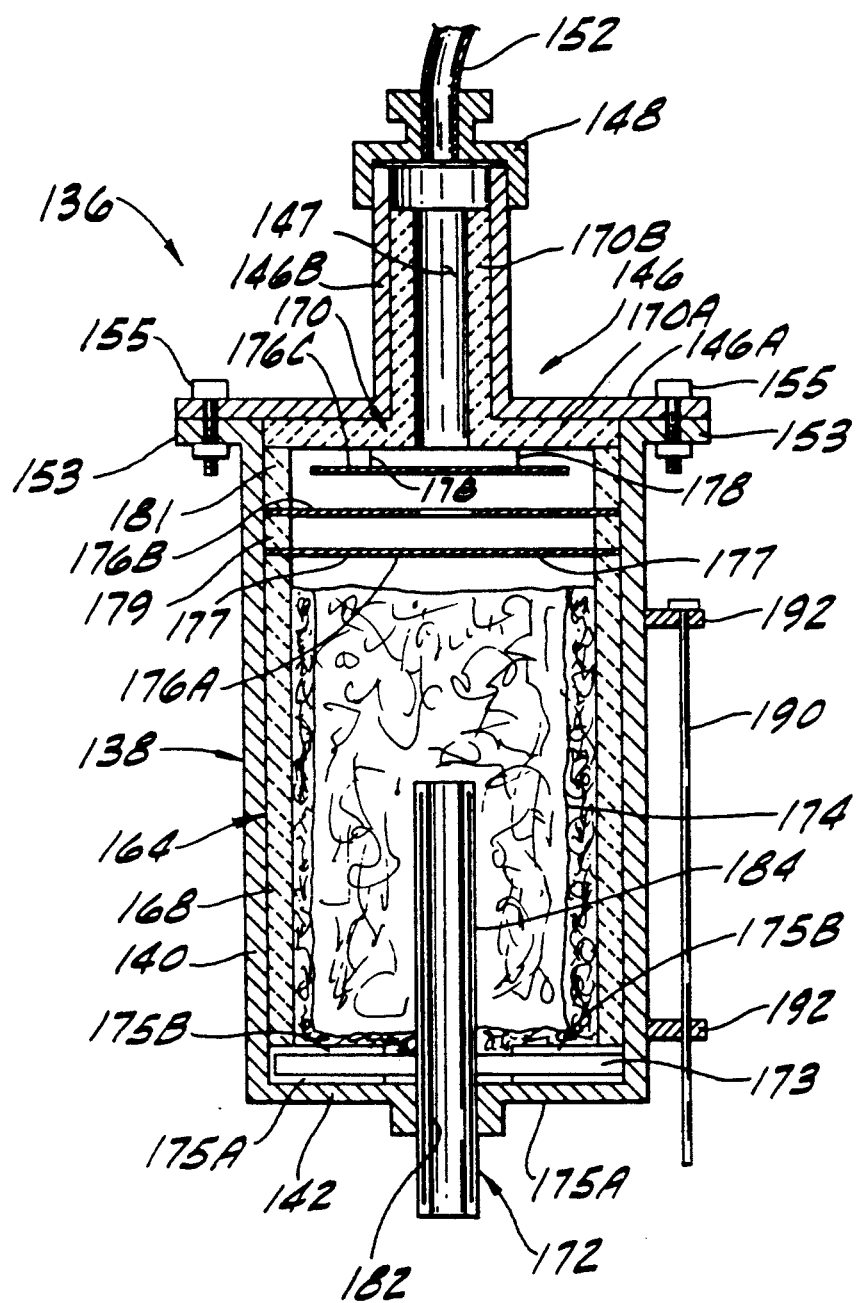

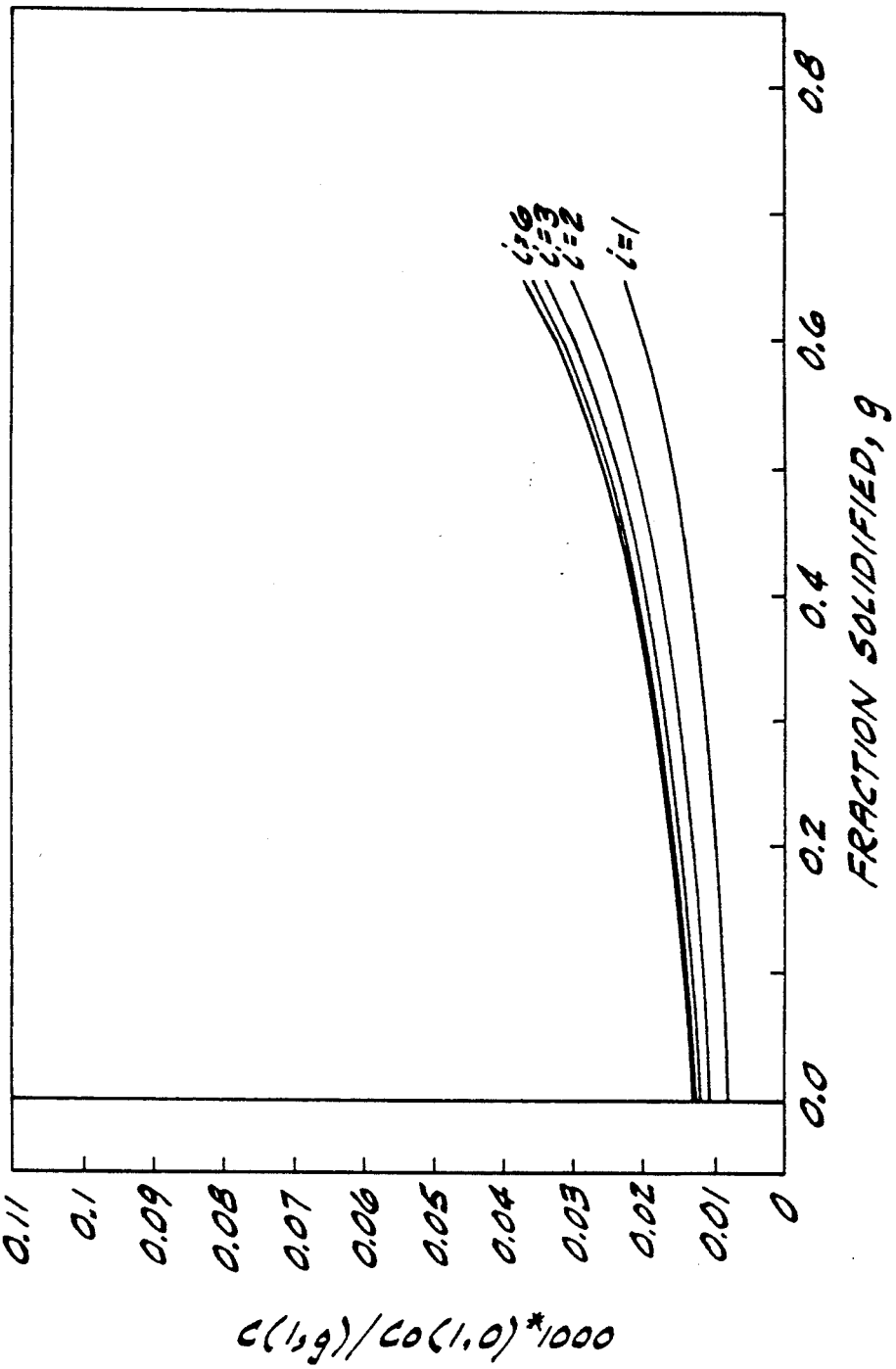

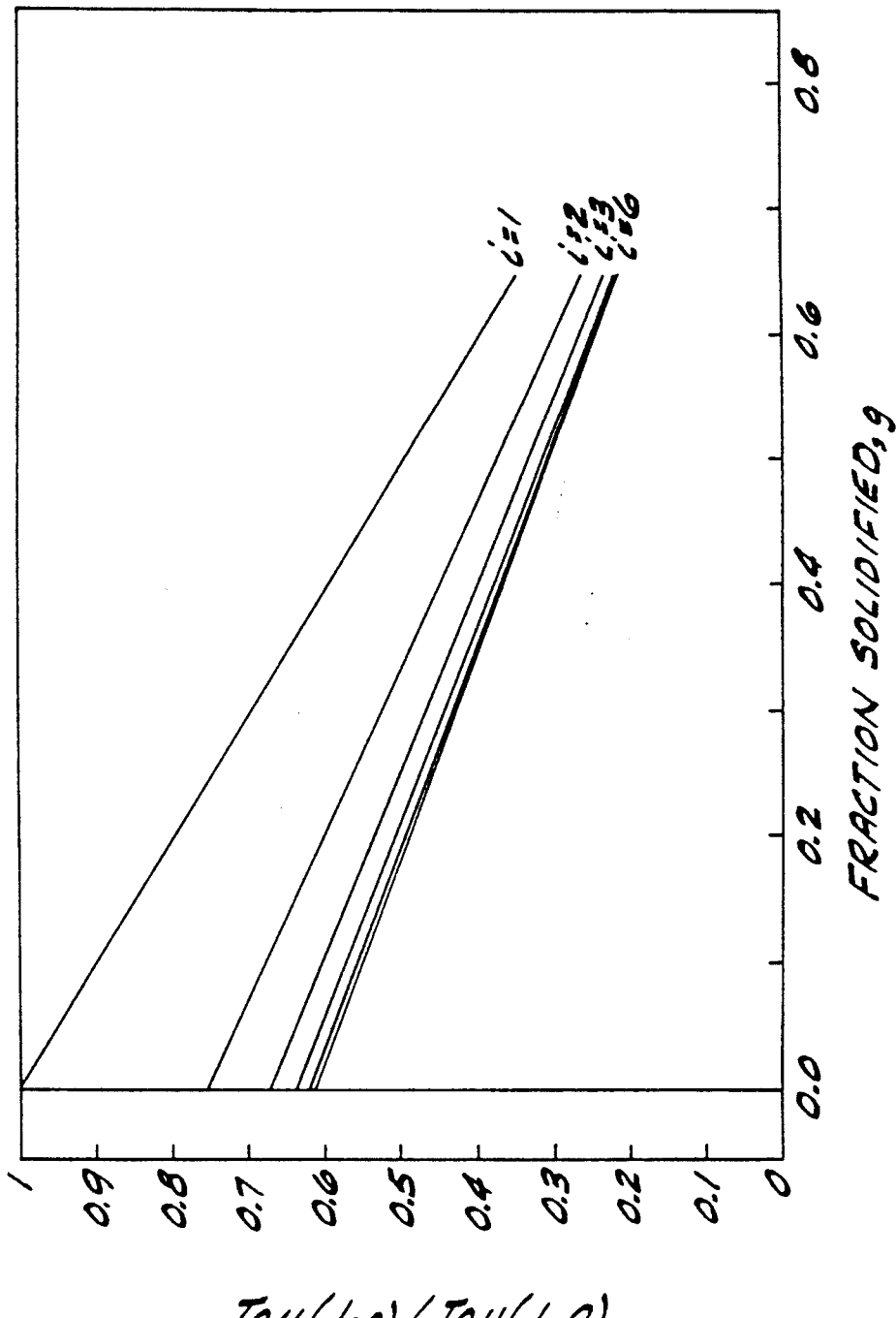

METHOD FOR GROWING MULTIPLE SINGLE CRYSTALS AND APPARATUS FOR USE THEREIN

BACKGROUND OF THE INVENTION

This invention relates generally to method and apparatus for growing a single crystal and more particularly to a method for growing multiple crystals and apparatus used in the method.

The substantial majority of monocrystalline silicon which is used to make silicon chips for the solid-state electronics industry is produced by the Czochralski method. Briefly described, this method involves melting chunks of high-purity polycrystalline silicon in a quartz crucible located in a specifically designed furnace to form a silicon melt. An inert gas such as argon is typically circulated through the furnace. A relatively small seed crystal is mounted above the crucible on a pulling wire which can raise and lower the seed crystal. The crucible is rotated and the seed crystal is lowered into contact with the molten silicon in the crucible. When the seed begins to melt, it is slowly withdrawn from the molten silicon and starts to grow, drawing silicon from the melt.

To increase the rate of production of single crystal from one furnace, it is desirable to grow more than one crystal from the silicon melt in the crucible before the crucible is replaced with a new crucible containing a fresh batch of silicon. The process of replacing the crucible is time consuming and considerably slows the rate of production of crystals. Although it is possible to add molten silicon to the melt after the crystal is grown or during the growth process, the number of crystals which may be grown from the melt is still limited by the concentration of impurities such as Fe and C in the melt. The concentration of Fe, C and other impurities in the melt is initially in the parts per million and parts per billion range, which is necessary to produce crystals of sufficient purity. The impurities have different affinities for remaining in liquid or going to a solid form in the crystal during the growth process. This affinity is represented numerically by the segregation coefficient of the particular impurity. If the segregation coefficient is less than one, the impurity tends to remain in the liquid as silicon is drawn off by the seed crystal. For example, C has a coefficient of 0.01 and Fe has a coefficient of $8 \times 10^{-6}$. Therefore, even if new silicon is added to the melt, the concentration of these impurities quickly grows to unacceptable levels, and the crucible must be replaced with a new crucible containing a fresh batch of molten silicon.

SUMMARY OF THE INVENTION

Among the several objects and features of the present invention may be noted the provision of a method for growing single crystals in which multiple crystals may be grown from a replenished batch of molten source material while maintaining purity within specifications; the provision of such a method which prevents contamination of the batch of molten source material during the purification process; the provision of such a method in which purification can be carried out quickly so that a new growth process can begin; and the provision of such a method which is simple to use.

Still further among the several objects and features of the present invention may be noted the provision of apparatus for accomplishing the objects of the aforementioned method; and the provision of such apparatus which may draw off the precise volume of melt needed for purification.

Generally, a method of the present invention for growing multiple high-purity single crystals from a replenished melt by maintaining the purity of molten source material in the melt held in a crucible in a furnace of the type used for growing high-purity single crystals includes the steps of: growing at least one crystal from the source material in the crucible; extracting a portion of a volume of the melt remaining in the crucible; adding high-purity source material to the melt; and growing at least one more single crystal.

Extractor apparatus constructed according to the principles of the present invention is adapted for use in the stated method. The apparatus comprises a receptacle enclosing a volume adapted to receive molten source material therein. Means thermally insulates the volume in the receptacle, inlet means associated with the receptacle is adapted to conduct molten source material into the receptacle. Means draws molten source material into the receptacle.

Other objects and features of the present invention will be in part apparent and in part pointed out hereinafter.

BRIEF DESCRIPTION OF THE DRAWINGS

FIG. 3 is a schematic longitudinal section of a receptacle of the apparatus;

FIG. 4 is a schematic section of a receptacle of a second embodiment;

FIG. 5 is a section of a tubular member taken in a plane including line 5—5 of FIG. 3;

FIGS. 8(a)-(b) are graphs showing the concentration of the impurity C in the crystals produced without using the method of the present invention and using the method of the present invention; and FIGS. 9(a)-(b) are graphs showing the lifetime of semiconductor material produced without using the method of the present invention and using the method of the present invention.

Corresponding reference characters indicate corresponding parts throughout the several views of the drawings.

DETAILED DESCRIPTION OF THE PREFERRED EMBODIMENTS

Figure 1:
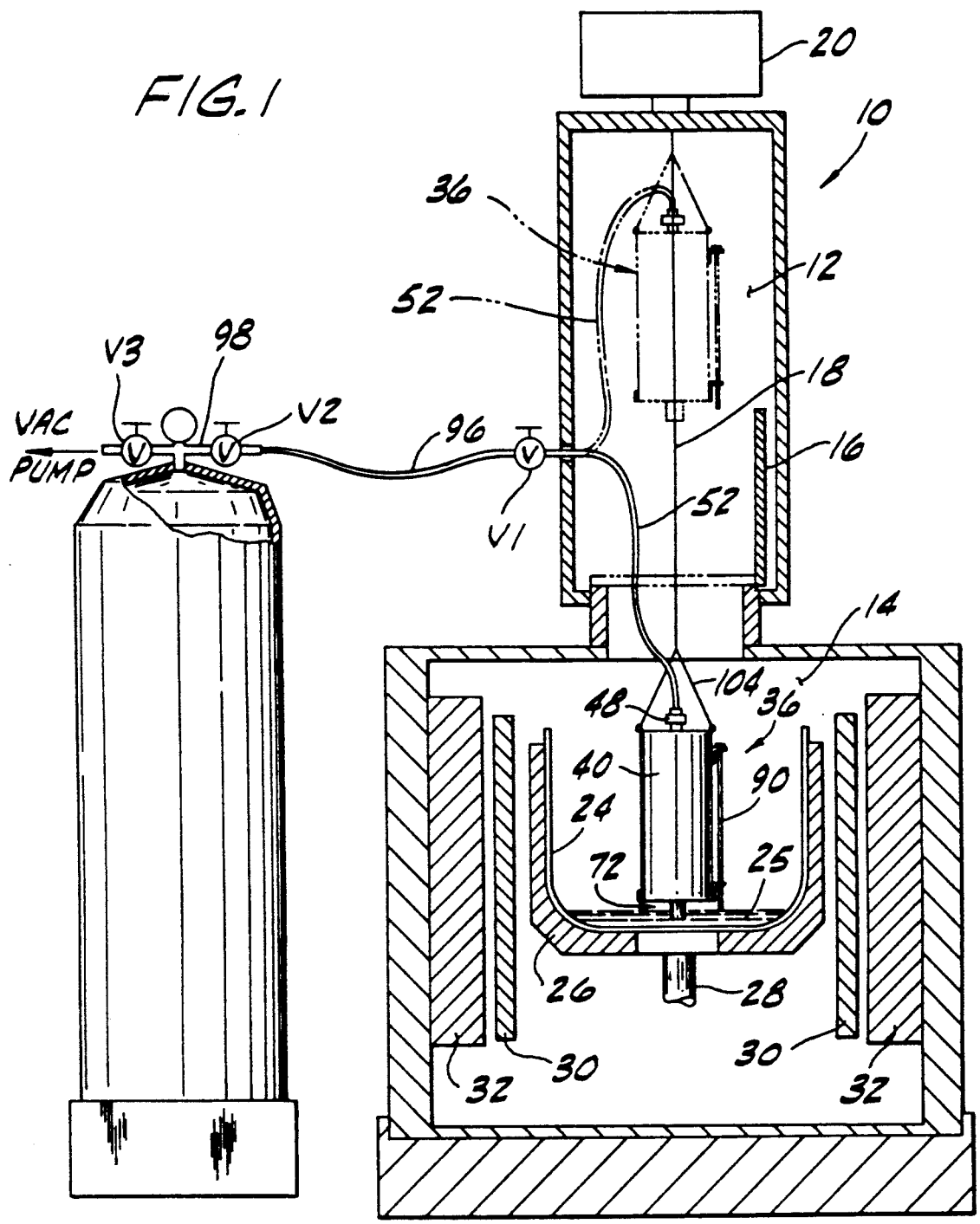
FIG. 1 is a schematic partial section of a furnace for producing single crystals showing apparatus for use in maintaining the purity of molten source material in the furnace.

Referring now to the drawings, and in particular to FIG. 1, a furnace, generally indicated at 10, of the type used to grow monocrystalline silicon ingots is shown to comprise a pulling chamber 12 and a crystal growth chamber 14. A gate valve or hatch 16 is pivotally mounted on the furnace between the pulling chamber 12 and the crystal chamber 14 for swinging between an open position (shown in solid in FIG. 1), in which the pulling chamber and the crystal growth chamber are in communication, and a closed position (shown in phantom in FIG. 1), in which the pulling chamber and crystal growth chamber are isolated from one another. A pulling wire 18 depends from a crystal lifting mechanism 20, which operates like a winch to selectively reel in and let out the pulling wire. During the crystal growing process, a seed crystal (not shown) is held at the lower end of the pulling wire.

A crucible 24 in the crystal growth chamber 14 containing molten crystal source material (in the illustrated embodiment, high-purity silicon) is held by a cup-shaped turntable 26 for rotation on a shaft 28 depending from the turntable and connected to a motor (not shown). A graphite heater and a thermal shield adjacent to the crucible and turntable in the crystal growth chamber 14 are schematically shown at 30 and 32, respectively. A door (not shown) in the furnace 10 provides access to the pulling chamber 12 to remove silicon ingots after growing, and to insert and remove the extractor apparatus described below.

The furnace 10 described to this point in the description is of the type which is well known in the art for use in single crystal silicon crystal growth by the Czochralski method. An example of such a furnace is the Hamco 2000CG, manufactured by Kayex Corp., a unit of General Signal Corp., Rochester, N.Y. In this method chunks of polycrystalline silicon are melted in the crucible 24 in the furnace 10 to form a silicon melt 25. The interior of the furnace 10 is evacuated to a vacuum pressure and an inert gas such as argon is typically circulated through the furnace. A relatively small seed crystal (not shown) is mounted by a seed holder (not shown) above the crucible 24 on the pulling wire 18 attached to the crystal lifting mechanism 20 which can raise and lower the seed crystal. The crucible 24 is rotated and the seed crystal is lowered into contact with the silicon melt 25 in the crucible. When the seed begins to melt, it is slowly withdrawn from the molten silicon and starts to grow by solidifying silicon from the melt 25.

In order to improve efficiencies and increase the rate of output of crystals by the furnace 10, the supply of molten silicon in the crucible is recharged so that a new crystal may be grown without replacing the crucible 24 and the silicon melt 25. This is accomplished by adding new molten silicon to the melt 25 after the crystal growth process ("Batch Recharge Czochralski") or by continuously adding molten silicon to the melt ("Continuous Recharge Czochralski"). However, the number of crystals which can be grown before the molten silicon in the crucible becomes too heavily concentrated with impurities is severely limited because of the low segregation coefficients of many of the impurities in the molten silicon. Typically, after a second crystal is grown from the replenished silicon melt 25, the concentration of impurities is too high to produce another crystal of sufficiently high quality for use in semiconductor applications.

Referring now again to FIG. 1, extractor apparatus for use in the crystal growth process to maintain the purity of the silicon melt 25 is shown to comprise a receptacle, indicated generally at 36, enclosing a volume adapted to receive molten silicon from the melt 25 therein. The extractor apparatus, as described more fully below, is used to draw off a portion of the molten silicon in the crucible 24 after a crystal growth process. A first embodiment of the receptacle 36, shown in FIG. 3, includes a shell generally indicated at 38, and made of powder metallurgy molybdenum, a refractory metal. The shell 38 includes a cylindrical body 40, and a generally circular bottom plate 42 attached to the body with molybdenum bolts 44. A cap 46 has a generally flat, annular portion 46A, and a tubular portion 46B projecting upwardly from a central opening in the annular portion, the tubular portion having an open upper end defining an outlet 47 from the receptacle 36. A stainless steel fitting 48 attached to the upper end of the tubular portion 46B of the cap connects the receptacle 36 via flexible stainless steel tubing 52 (broadly "flexible conduit means") to a source of vacuum pressure. A hold down assembly, indicated generally at 54, for the cap 46 includes a ring 56 having a plurality of axial bores (not shown) spaced at regular intervals around the ring, and a plurality of radial bores 58 spaced circumferentially around the ring. Stainless steel bolts 60 extending through the radial bores 58 in the ring engage and hold down the annular portion 46A of the cap. The hold down assembly 54 is secured to the body 40 of the shell by molybdenum bolts 62 received through bores in the body and into the radial bores 58 in the ring 56.

The cap 46 and hold down assembly 54 as shown herein are made of stainless steel. The materials chosen for the extractor apparatus have been selected for their refractory or insulating properties, and/or their resistance to chemical reaction in the hostile atmosphere of the furnace 10. However, it is to be understood that materials having satisfactory properties other than the materials specified herein may be used and still fall within the scope of the present invention.

Prior to attachment of the hold down assembly 54 to the shell body 40, a thermally insulating liner is inserted into the shell 38. The liner comprises a solid graphite lining, generally indicated at 64, including an annular base 66 having a threaded central opening 66A, a tubular portion 68, and an annular lid 70. In the preferred embodiment, the solid lining 64 is made of purified extruded graphite, Carbon Graphite Group grade 873RL or 890RL, available from Carbon-Graphite Group, Inc., St. Marys, Pa., and has a minimum thickness of about 0.25 inches for receptacles having diameters less than about 4 inches, and a minimum thickness of about 0.35 inches for larger diameter receptacles. An inlet tube (broadly "tubular member"), generally indicated at 72, is adapted to conduct molten source material from the crucible 24 into the receptacle 36. The inlet tube 72 has exterior threads and may be screwed into the threaded opening 66A in the base 66 for sealing connection to the base. Together, the base 66 and the inlet tube 72 are positioned in the shell 38 so that the base rests on the bottom plate 42 of the shell with the lower portion of the inlet tube projecting through the opening in the bottom plate and below the receptacle 36, and an upper portion of the tube projecting upwardly from the bottom plate into the volume enclosed by the receptacle.

After sliding the tubular portion 68 of the solid lining 64 into the shell 38, a lining indicated generally at 74 of purified graphite felt (e.g., type X3100, grade WDF graphite felt manufactured by National Electric Carbon Corp. of Greenville, S.C.) is placed in the shell. The felt lining 74 includes a bottom annular member 74A adapted to receive the inlet tube 72 through its central opening and a tubular member 74B covering the inwardly facing wall of the tubular portion 68 of the solid graphite lining 64, and is adapted to compress as silicon solidifies in the receptacle 36 for protecting the tubular Portion and base of the solid graphite lining from damage. A single layer of graphite felt lining 74 of 0.25 inches thickness has been found sufficient for receptacles having diameters of 5 inches or less. A second layer (not shown) of 0.25 inch thick graphite felt is used for receptacles of greater diameter. The solid graphite lining lid 70 rests on the upper end of the tubular portion 68 of the solid graphite lining 64. An inverted, cup-shaped deflector 76 is suspended from the lid 70 with hangers 78 made of molybdenum below the lid's central opening. The deflector 76 prevents silicon drawn into the receptacle 36 from passing out of the receptacle through the outlet 47 at the top thereof, but allows the passage of gases around it and out of the receptacle for maintaining vacuum pressure in the receptacle. Attachment of the hold down assembly 54 to the shell 38 firmly holds the base 66 of the solid graphite lining in sealing relation with the bottom plate 42 of the shell. The hold down assembly 54 also facilitates sealing at the joints between the tubular portion 68 and base 66 of the solid graphite lining 64, and between the tubular portion 68 and the lid 70, by pressing them tightly together.

As shown in FIGS. 3 and 4, the inlet tube 72 is made of semiconductor grade quartz glass (e.g., GE 234, 224, 214A, or 214) available from General Electric Corp., Quarts Products Dept., Cleveland, Ohio), and includes an inner wall 82 and an outer wall 84 which are fused together at the top and bottom thereof and define a cylindrical space 86 between them. In the illustrated embodiments, the inner wall 82 has a thickness of approximately 0.04 inches, and the outer wall 84 has a thickness of approximately 0.06 inches. The outside diameter of the outer wall 84 is approximately 0.78 inches, and the inside diameter of the inner wall 82 is approximately 0.47 inches. However, the dimensions of the inlet tube 72 may be other than specified and still fall within the scope of the present invention. A vent hole, 88 is formed in the outer wall 84 to relieve pressure in the space 86 as the inlet tube is subjected to heat in the furnace 10. The outer wall 84 is formed with the threads for sealing engagement in the threaded opening 66A of the base 66 of the solid graphite lining 64. As described more fully below, the double walled construction of the inlet tube 72 helps to prevent pieces of the tube from breaking off and falling into the silicon melt 25 in the crucible 24.

A rod 90 mounted on the outside of the shell body 40 is used to gauge the depth of insertion of the lower end of the inlet tube 72 in the silicon melt 25 so a predetermined volume of the silicon melt will be drawn off. The rod 90 is made of the same high purity quartz glass as the inlet tube 72, and is mounted by tabs 92 made of molybdenum on the body 40. The tabs 92 are each secured to the body 40 with one of the bolts (62, 44) used for attaching the hold down assembly ring 56 and bottom plate 42, respectively, to the shell body. The rod 90 is received through openings in the tabs 92, with an upper, flanged end 94 of the rod supported by the upper tab 92 so that the rod projects below the bottom of the receptacle 36 a predetermined distance. Insertion of the lower end of the inlet tube 72 is to be stopped when the lower end of the rod 90 contacts the surface of the silicon melt 25 in the crucible 24 (i.e., the rod indicates to the operator to stop).

A second embodiment of the receptacle, indicated generally at 136, is shown in FIG. 4. Parts of the receptacle 136 corresponding to those in the receptacle 36 of the first embodiment are indicated by the same reference numeral preceded by a "1". The receptacle 136 includes a shell 138 made of stainless steel having a one-piece body 140 with an integral annular bottom wall 142, and a cap 146 having an outer annular portion 146A and a tubular portion 146B projecting upwardly from its center. A fitting 148 attaches flexible stainless steel tubing 152 to the source of vacuum pressure. An integral, radially outwardly projecting flange 153 at the upper end of the body 140 supports the cap 146. An inlet tube 172 has substantially the same construction as the inlet tube 72 described above, except its outer wall 184 has no external threads. The inlet tube 172 is fused to a quartz annular flange member 173 and inserted into the shell body 140 on an annular graphfoil seal 175A resting on the bottom wall 142 of the body. A second annular graphfoil seal 175B is located between the flange member 173 and the bottom end of a lower tubular portion 168 of a solid graphite lining 164. It has been found that the graphfoil seals 175A, 175B are necessary to maintain vacuum pressure in the receptacle 136 of the second embodiment, but that such seals are unnecessary in the receptacle 36 of the first embodiment. A tubular layer 174 of compressible graphite felt lines the interior facing wall of the lower tubular graphite lining portion 168.

The inverted, cup-shaped deflector 76 of the first embodiment is replaced with a set of baffles, designated 176A, 176B and 176C, which are made of molybdenum and supported in the receptacle 136. The lower baffle 176A supported by the lower tubular graphite lining portion 168 is generally circular with a plurality of circular openings 177 in it which are spaced from its center portion of the lower baffle. The annular intermediate baffle 176B spaced from the lower baffle 176A by an intermediate tubular graphite lining member 179 supports an upper tubular graphite lining member 181. The circular top baffle 176C is suspended by hangers 178 from a lid 170 of the solid graphite lining 164 which is supported on the upper tubular graphite lining member 181. The baffles 176A–176C create a tortuous path between the lower receptacle volume and the outlet 147 of the receptacle 136 which may be easily traversed by gases, but which prevents silicon from leaving the receptacle through the outlet. The lid 170 has an outer annular portion 170A and an integral tubular portion 170B projecting upwardly into the tubular portion 146B of the cap. A gauge rod 190 substantially identical to the rod of the first embodiment is mounted by stainless steel tabs 192 onto the shell body 140.

In both embodiments, the stainless steel tubing (52, 152) inside the furnace 10 is attached via a quick-connect vacuum coupling (not shown) in the wall of the pulling chamber 12 to a first valve V1. Another section of stainless steel tubing 96 extends from the first valve V1 to a second valve V2 attached to a fitting 98 of a vacuum reservoir tank 100. A third valve V3 attached to the fitting 98 controls communication of the tank 100 with a vacuum pump (not shown). Together, the tank 100 and the pump constitute herein a source of vacuum pressure. The volume of the tank 100 is approximately 100 times larger than that of the receptacle 36 so that there is no loss of vacuum pressure in the receptacle when the inlet tube 72 emerges from the silicon melt 25 during the extraction process.

The method of growing multiple high-purity silicon crystals from a single, replenished silicon melt 25 includes the steps of melting solid polycrystalline silicon in the crucible 24, and growing a monocrystalline ingot, such as by the Czochralski method described above. The ingot is pulled from the crystal growth chamber 14 to the pulling chamber 12 and the hatch 16 is shut to isolate the crystal growth chamber from the pulling chamber. The pressure in the pulling chamber 12 is raised to ambient in the furnace room and the ingot is then removed from the pulling chamber through a door (not shown) in the pulling chamber wall. The impurities in the melt 25 after the first growing process, such as iron (Fe) and carbon (C), will have risen to such a level that the concentration of impurities in a second crystal grown from the melt will increase substantially notwithstanding the addition of fresh silicon to the melt. After a second crystal is grown, another high quality crystal cannot be grown from the crucible 24, even though the silicon melt 25 is recharged with fresh silicon. Replacement of the crucible 24, or a purification of the silicon melt 25 in the crucible is required. To maximize the life of the melt 25 in the crucible 24, an extraction process is performed after each crystal growing process to purify the melt.

To begin the extraction process, a receptacle, such as the receptacle 36 of the first embodiment described above, is suspended by stainless steel cable 104 from the pulling wire 18. The fitting 48 is attached over the open upper end of the cap 46 to connect the receptacle 36 with the tubing 52 leading to the vacuum reservoir tank 100. However, the first and second valves V1, V2 are closed so that the pressure in the receptacle 36 is the ambient pressure in the furnace 10. The pulling chamber 12 is evacuated to the pressure of the crystal growth chamber 14. The hatch 16 is opened and the crystal lifting mechanism 20 is activated to begin lowering the receptacle into the crystal growth chamber 14. As the receptacle 36 is lowered into the crucible 24, the lower end of the inlet tube 72 is immersed in the silicon melt 25 remaining in the crucible after a crystal growth process. Downward movement of the receptacle 36 is stopped when the gauge rod 90 contacts the surface of the melt 25. The receptacle 36 is now in the position shown in FIG. 2(a). The vertical distance between the bottom of the inlet tube 72 and the bottom of the gauge rod 90 has been preset so that the inlet tube is immersed far enough to draw off a predetermined amount of liquid from the melt 25 before the bottom of the inlet tube emerges from the melt.

The pressure in the crystal growth chamber 14 is raised to about 300 torr, and the vacuum reservoir tank 100 has previously been evacuated to a pressure of less than 3 torr. The first and second valves V1, V2 are opened so that the receptacle 36 is in communication with the vacuum reservoir tank 100, and a substantial pressure differential between the interior of the receptacle and the surrounding ambient pressure in the crystal growth chamber 14 is developed. Molten silicon S is forced into the receptacle 36 through the inlet tube 72 in the manner illustrated in FIG. 2(b). Inside the insulated interior of the receptacle 36, the temperature is well below the freezing point for silicon, so that molten silicon entering the receptacle quickly solidifies. The graphite felt lining 74 allows the silicon to expand as it freezes without damage to the solid graphite lining 64. Eventually, a sufficient volume of the melt 25 is extracted and the lower end of the inlet tube 72 emerges from the melt and no further liquid silicon is drawn into the receptacle 36 (FIG. 2(c)). To prevent the extracted silicon from flowing out of the receptacle 36 after the level of the silicon melt 25 in the crucible 24 drops below the inlet tube 72, the vacuum surge system (i.e., vacuum reservoir tank 100) continues to pull gas into the receptacle until the extracted silicon solidifies.

Figure 2C:
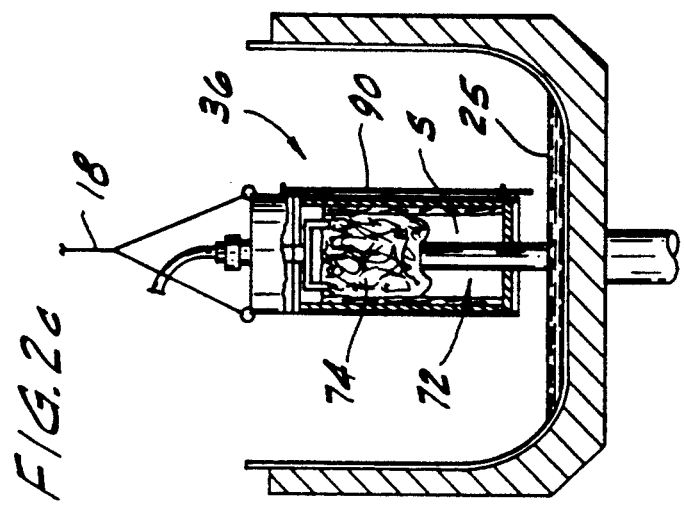
FIGS. 2(a)-(c) schematically show steps for extracting a portion of the molten source material.
Figure 2B:
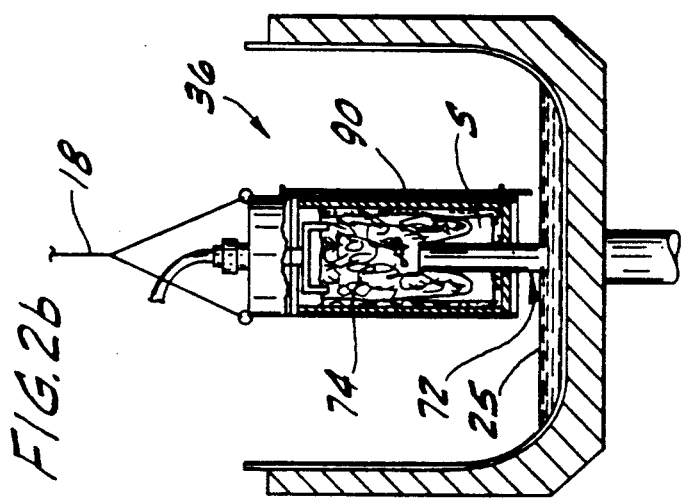
Figure 2A:
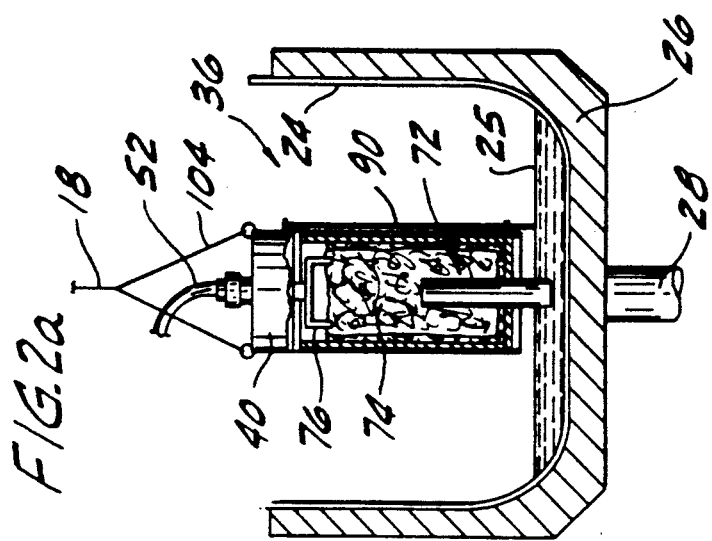
Figure 6:
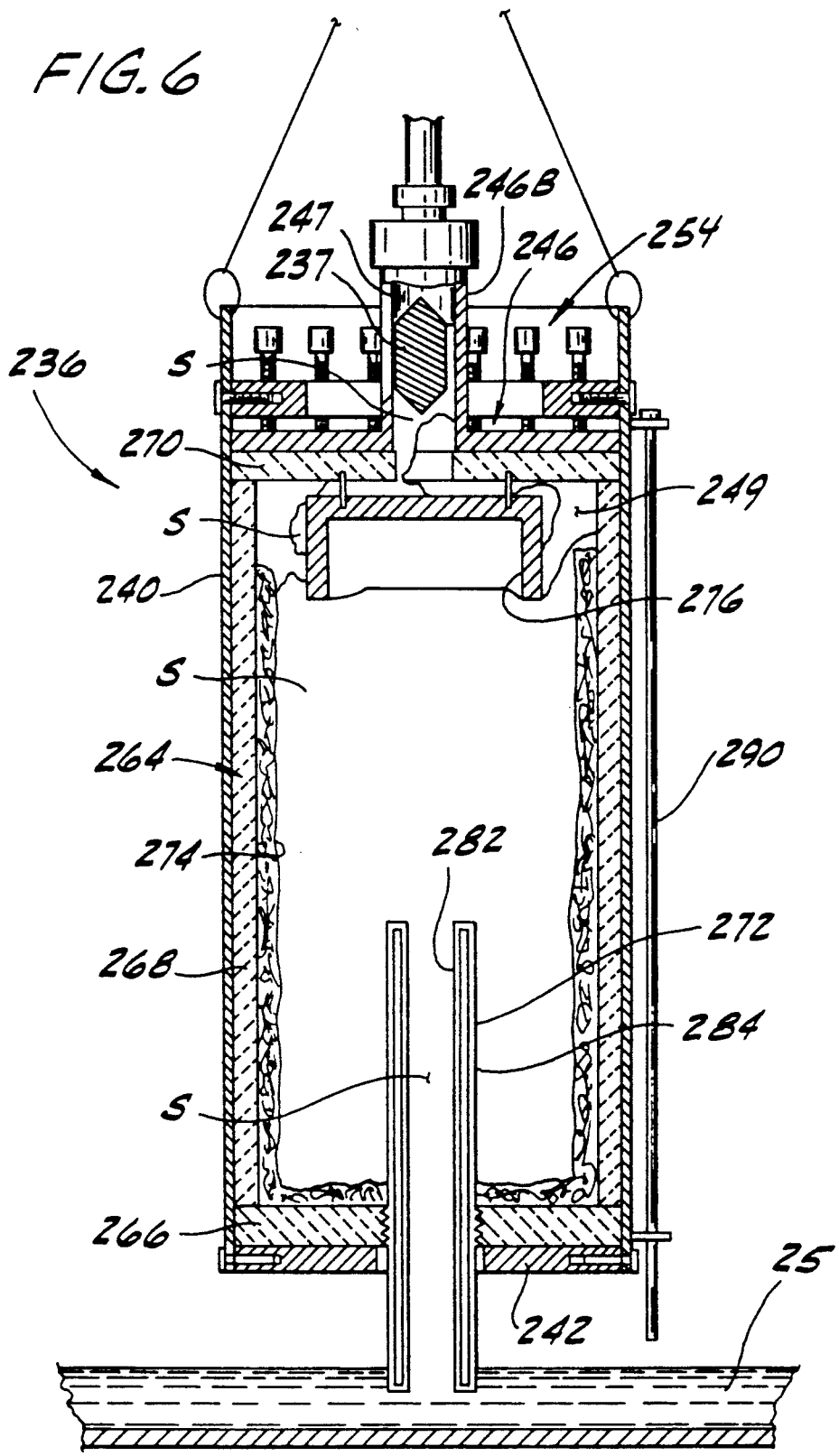
FIG. 6 is a schematic longitudinal section of a receptacle of a third embodiment.

The method described thus far and illustrated in FIGS. 2(a)-(c) may be referred to as an "underfilled" mode of extraction because the volume of the receptacle 36 is sufficiently large that the level of silicon never rises above the top of the inlet tube 72 in the receptacle. However, an "overfilled" mode is also contemplated in which the level of silicon rises above the top of the inlet tube 72 and plugs the outlet 247 so that communication with the vacuum in the vacuum reservoir tank is cut off. A third embodiment of the receptacle, indicated generally at 236, for use in the overfilled mode is shown in FIG. 6. The structure of this receptacle 236 is substantially the same as that of the first embodiment, and corresponding parts of the receptacle are indicated by the same reference numerals as those of the receptacle of the first embodiment, but with a prefix "2". A stainless steel plug 237 having a diameter less than the inner diameter of the tubular portion 246B of the cap 246, but greater than the diameter of the opening in the lid 270 of the solid graphite lining 264 is located in the tubular portion of the cap. The flow of gas from the receptacle 236 keeps the plug 237 off the lid 270 during extraction of the silicon. Eventually, the receptacle 236 becomes so full that the silicon S in the receptacle is drawn around the peripheral edges of the deflector 276 and up into the tubular portion 246B of the cap. The silicon S freezes immediately upon contact with the stainless steel plug 237 so that the outlet 247 is soon blocked. A volume of gas 249 at vacuum pressure in the receptacle 236 is trapped and acts to hold the extracted silicon S in the receptacle.

The inlet tube 72 has been particularly designed to prevent contamination of the melt 25 during extraction of a portion of the volume of the liquid silicon in the melt. One form of contamination could be the introduction of impurities into the melt 25 from the dissolution of the inlet tube 72 by the silicon liquid when the inlet tube contacts the liquid. This would clearly defeat the purpose of purifying the silicon melt 25. Another form of contamination could be solid, slowly melting or stable debris falling off the inlet tube 72. Solids in the melt 25 can cause dislocations in the crystal if they contact the growing crystal at the outside edge of the solid/liquid interface. A crystal ingot grown with such dislocations would be unfit for use in any semiconductor application and would have to be discarded. However, the quartz glass from which the inlet tube 72 is made of the same as that used to make the crucible 24, which is of the same purity as the silicon from which the crystals are grown. Although a small amount of the quartz glass is dissolved during the extraction process, the level of impurities in the glass is sufficiently low as not to contaminate the melt 25.

Quartz glass is very brittle at its temperature in the crystal growth chamber 14 just below the melting point of silicon, so that the problem of preventing pieces of the inlet tube 72 from breaking off and falling into the melt 25 remains. If the overfilled mode of extraction is used (FIG. 6), the inlet tube 272 will be filled with silicon after extraction is completed. As the silicon freezes and expands, there is a substantial risk of radially outward fracture and spalling of the inner wall 282 of the inlet tube 272. Even if the underfilled mode of extraction is used (FIGS. 2(a)-2(c)), some liquid silicon remains on the inner wall 82 of the inlet tube 72 because of surface tension of the liquid. The freezing and expansion of these drops of liquid silicon present the possibility of fracture and spalling of the inner wall 82. However, in both modes the outer wall 84, 284 of the inlet tube contains any fractured portions of the inner wall 82 so that pieces of the inner wall do not fall into the melt 25. In the underfilled mode, the freezing silicon inside the receptacle 36 can compress the outer wall 84 of the inlet tube and cause fracture of the outer wall. Here, the inner wall 82 prevents pieces of the outer wall 84 from falling down the inlet tube 72 and into the melt 25.

When extraction is completed, the crystal lifting mechanism 20 is activated to lift the receptacle 36 out of the crucible 24 and the crystal growth chamber 14. Once in the pulling chamber 12, the hatch 16 is closed to isolate the crystal growth chamber 14 from the pulling chamber. Pressure in the pulling chamber 12 is brought to ambient pressure in the furnace room, and the receptacle 36 is disconnected from the tubing 52 and the pulling wire 18. The receptacle 36 is removed from the pulling chamber 12 and the seed holder carrying a new seed crystal is attached to the pulling wire 18. If the batch recharge Czochralski method is being used, fresh silicon would be added to the melt 25 as this juncture. In any event, proper temperature and pressure conditions in the crystal growth chamber 14 are reestablished, and another high-purity crystal is grown.

After removing the receptacle 36 from the pulling chamber 12, the hold down assembly 54 and cap 46 are removed. The extracted silicon, the graphite felt lining 74 and the inlet tube 72 are removed from the shell 38 and discarded. The shell 38, and frequently the solid graphite lining 64, may be reused with a new graphite felt lining and inlet tube for the next extraction process.

Figure 7A:
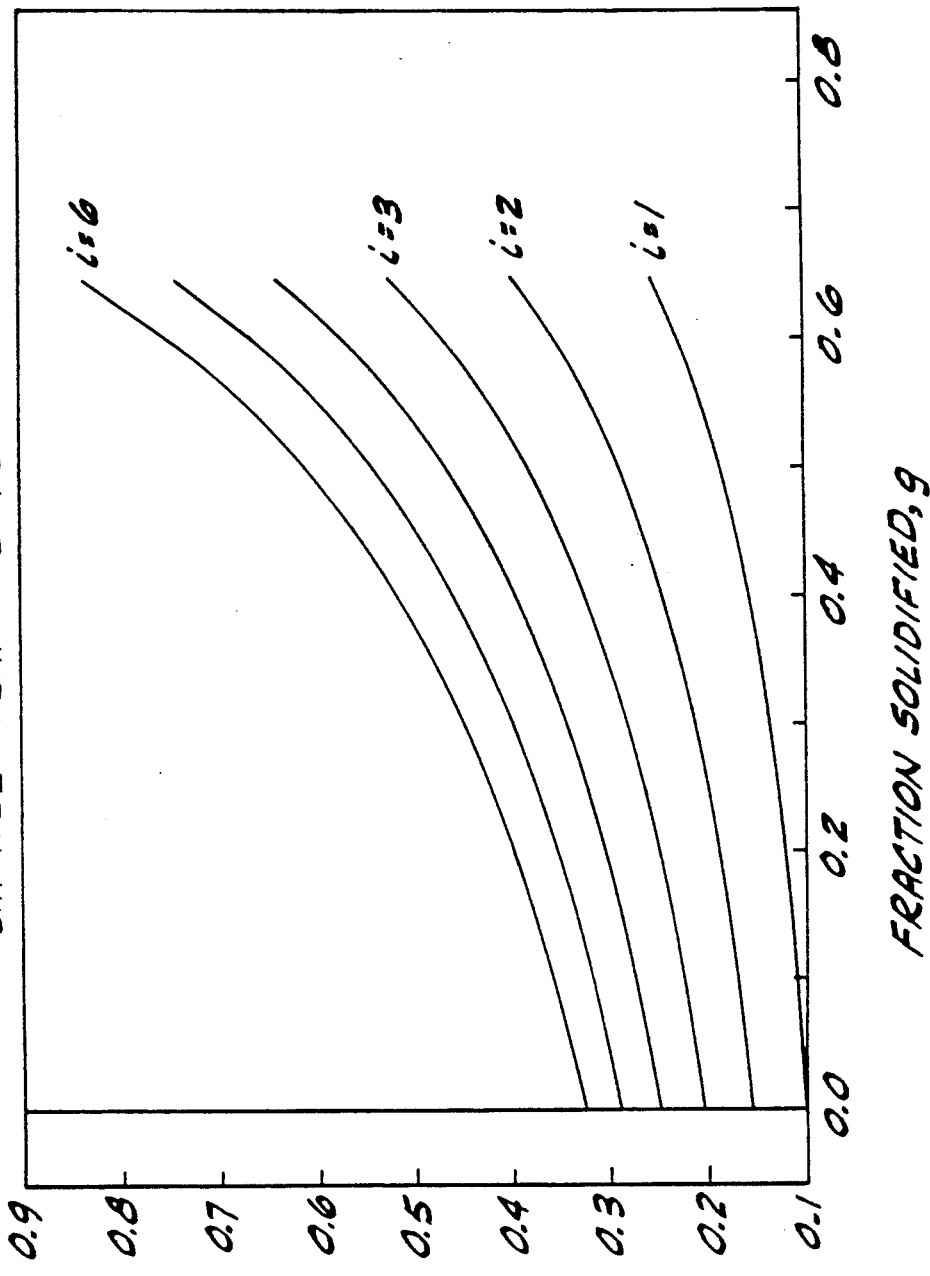
FIGS. 7(a)-(b) are graphs showing the concentration of the impurity Fe in the crystals produced without using the method of the present invention and using the method of the present invention.
Figure 7B:
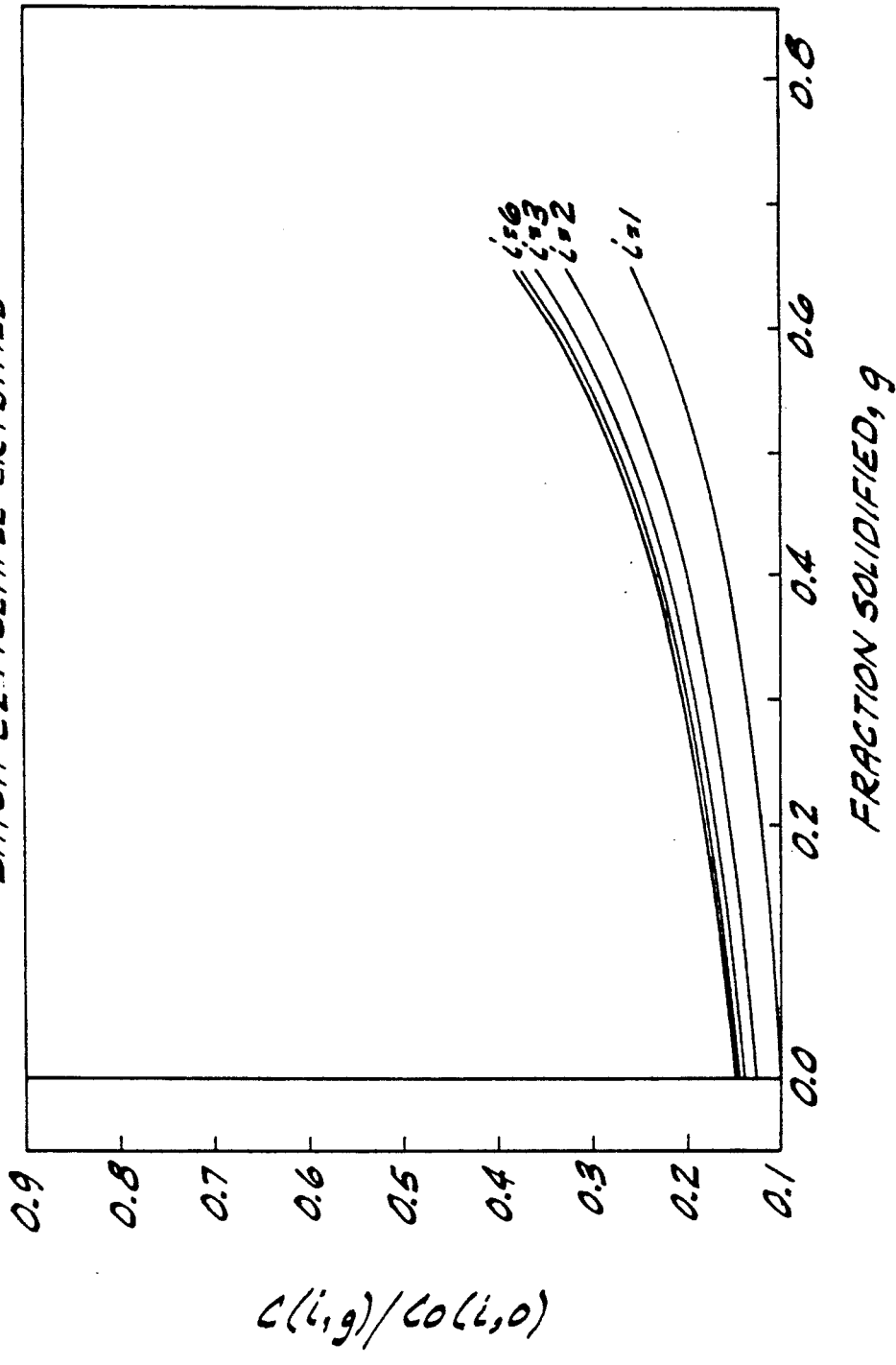
Figure 8A:
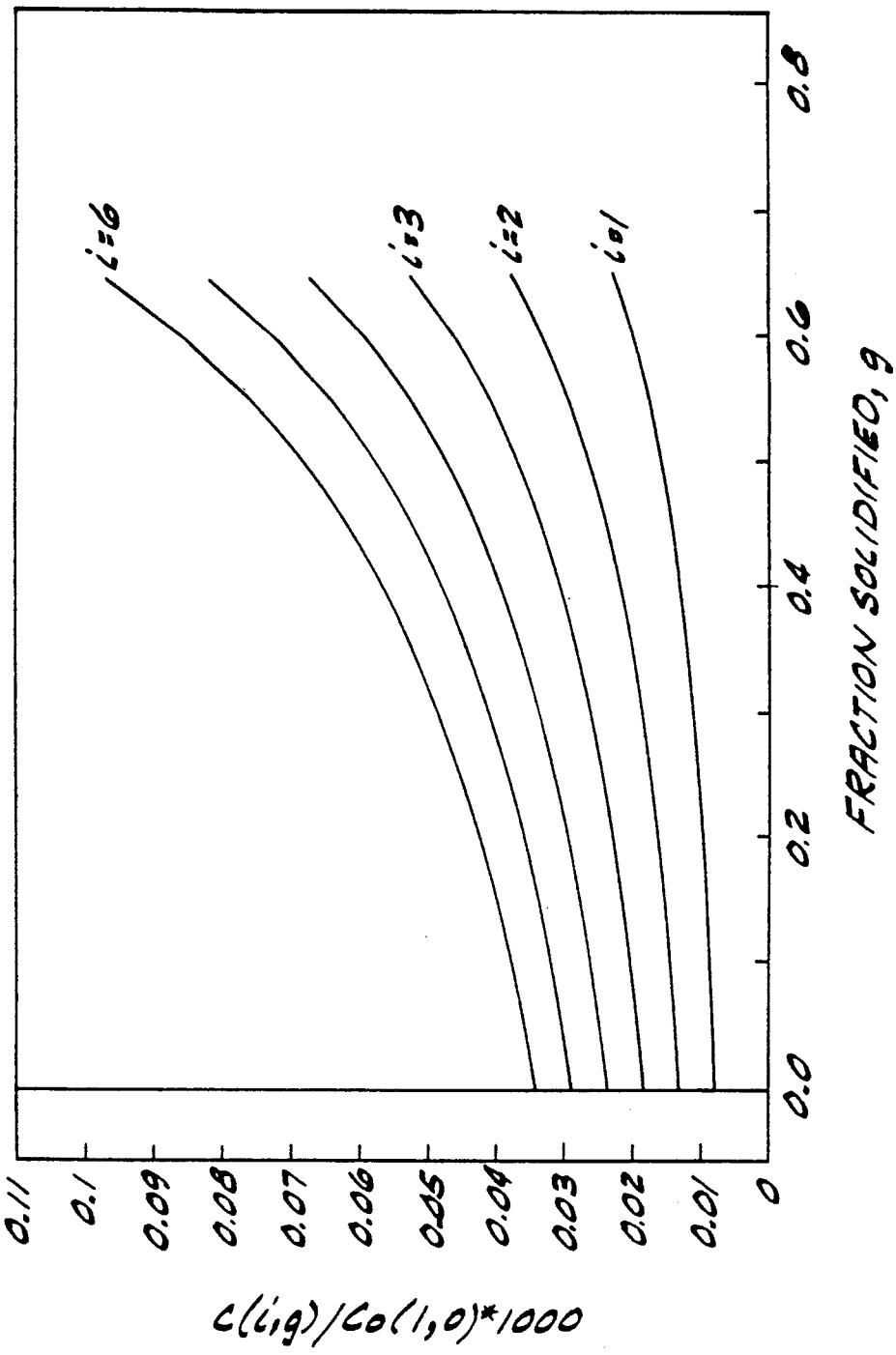

It has been calculated that using the extraction process described herein, wherein 50% of the volume of the liquid silicon in the melt 25 remaining after each crystal is grown is removed, at least six crystals may be grown without replacing the crucible 24 with a new crucible containing completely fresh silicon. The concentration of the impurity carbon (C) in the $n^{th}$ crystal grown when the extraction process is not used, as compared to the concentration when the extraction process is used is graphically illustrated in FIGS. 7(a) and 7(b). The same comparison for the impurity iron (Fe) is shown in FIGS. 8(a) and 8(b). More specifically, the graphs plot the concentration of the impurity in the crystal (normalized by the initial concentration of the impurity in the polycrystalline silicon source material) against the fraction of the melt solidified. As may be seen, using the extraction process, the concentration of impurities in the sixth crystal grown does not differ dramatically from the concentration of impurities in the second crystal grown when no extraction occurs.

Figure 9A:
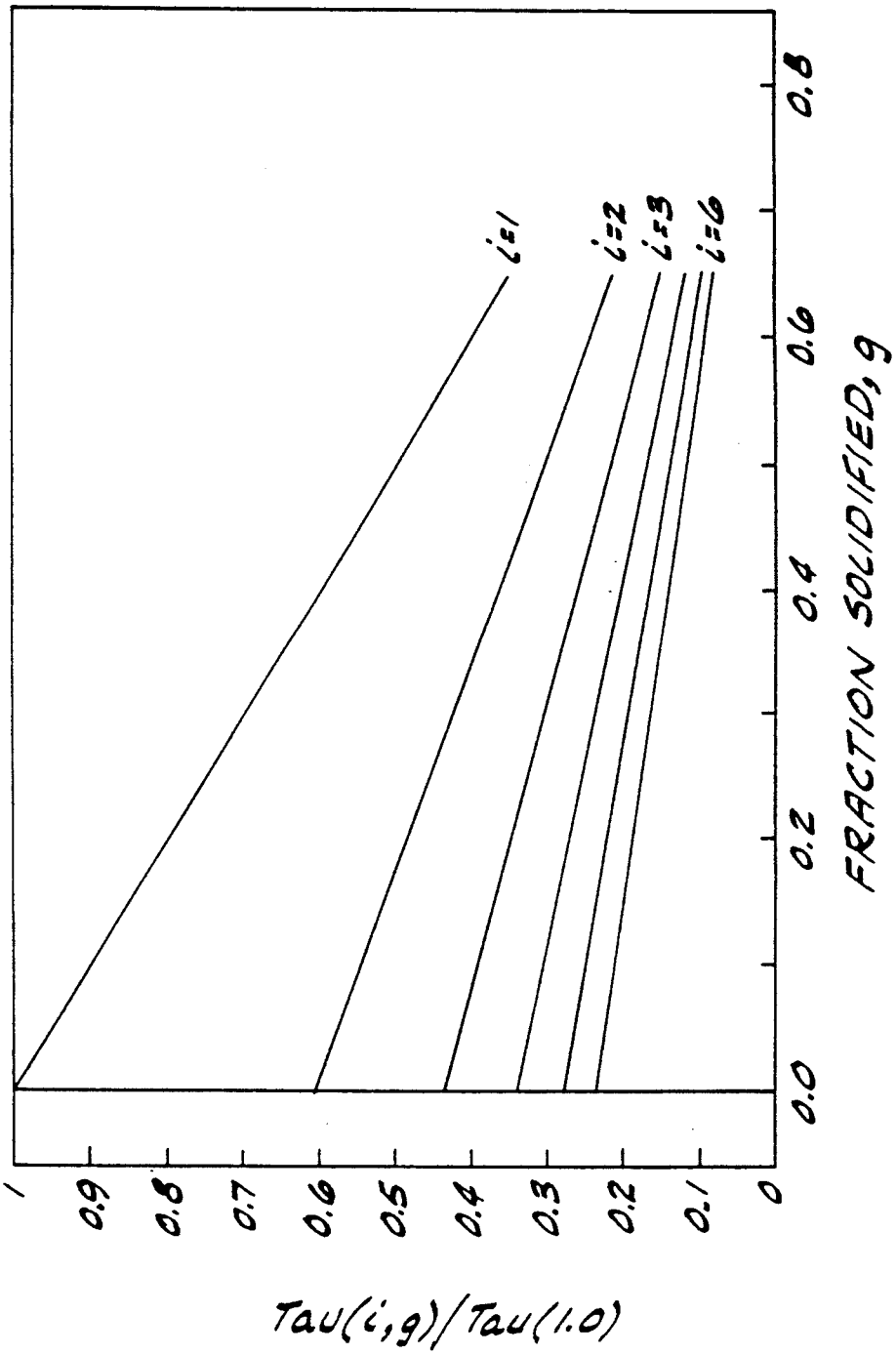

A related comparison for the impurity Fe is shown in FIGS. 9(a) and 9(b). These graphs plot the calculated lifetime of the minority carrier (i.e., the time which the silicon crystal can hold an electric charge) against the fraction of silicon in the melt which has been solidified in the crystal. The lifetime of the crystal is a key characteristic in the usefulness of the crystal in the semiconductor applications for which it is intended. The lifetime of a particular crystal correlates to the amount of impurities (in this case, Fe) it contains. To generalize the calculations, the lifetime, Tau, has been normalized by the lifetime of the seed end of the first crystal grown from a melt. The lifetime of crystals grown using the extraction process described herein falls off much more slowly (particularly after the growth of the second crystal) than the lifetime for crystals grown from a single, replenished melt without extraction. Thus, multiple crystal growing processes without replacing the crucible 24 are practical using the extraction process described herein.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method for growing multiple high-purity single crystals from a replenished melt by maintaining the purity of molten source material in the melt held in a crucible in a furnace of the type used for growing high-purity single crystals, the method comprising the steps of:

growing at least one crystal from the source material in the crucible;

extracting a substantial liquid portion of the volume of the melt remaining in the crucible independently of growing another crystal from the melt whereby impurities in the melt tending to remain in liquid during said step of growing at least one crystal are removed with the extracted liquid portion;

replenishing the melt with high-purity source material; and growing at least one more single crystal.

2. A method according to claim 1 wherein said step of adding high-purity source material to the melt comprises the step of continuously adding high-purity source material to the melt throughout said crystal growing and source material extracting steps.

3. A method according to claim 1 wherein said step of extracting a volume of the melt comprises the steps of inserting a receptacle into the furnace, lowering the receptacle down into contact with the melt, and admitting source material into the receptacle.

4. A method according to claim 3 wherein at least approximately 50% of the volume of the melt is extracted.

5. A method according to claim 3 wherein said step of admitting source material into the receptacle comprises the step of applying a vacuum pressure from a vacuum source to the receptacle thereby drawing liquid source material into the receptacle.

6. A method according to claim 5 wherein vacuum pressure is applied to the receptacle until source material solidifying in the receptacle blocks communication of the receptacle with the vacuum source.

7. A method according to claim 3 wherein the step of lowering the receptacle down into contact with the melt comprises the step of lowering the receptacle down into the melt a depth corresponding to the volume of the melt to be extracted.

8. A method according to claim 1 wherein the step of growing at least one crystal comprises the step of growing at least one crystal by the Czochralski method wherein a crystal is pulled upwardly out of the melt on a pulling wire, and wherein the step of extracting a volume of the melt comprises the steps of hanging a receptacle in the furnace on the wire used for pulling the crystal, lowering the receptacle down into contact with the melt, and admitting source material into the receptacle.

* * * * *